United States Patent [19]

Merrell

[11] 4,002,985
[45] Jan. 11, 1977

[54] CHANNEL SELECTION INDICATOR FOR MEMORY TUNING SYSTEM

[75] Inventor: Richard G. Merrell, Darien, Ill.

[73] Assignee: Zenith Radio Corporation, Chicago, Ill.

[22] Filed: Jan. 12, 1976

[21] Appl. No.: 648,558

[52] U.S. Cl. .............................. 325/455; 325/464; 325/470

[51] Int. Cl.² ......................................... H04B 1/16

[58] Field of Search .......... 325/334, 335, 455, 464, 325/465, 458, 459, 468, 470; 334/11, 14, 15, 86; 445/1; 235/92 DP

[56] References Cited
UNITED STATES PATENTS 3,961,261  6/1976  Pflasterer ......................... 325/459

*Primary Examiner*—Benedict V. Safourek
*Assistant Examiner*—Marc E. Bookbinder
*Attorney, Agent, or Firm*—Nicholas A. Camasto

[57] ABSTRACT

An all-channel two mode television tuning system includes a counter for sequentially generating channel numbers to adjust tuning. An 82 × 1 bit read/write memory is addressed in a program mode by the generated channel numbers to provide locations for storage of signals for tuning to preselected channels. Blanking circuitry responsive to the 60Hz line frequency as a clock source causes repetitive flashing of the channel number indicators until the generated channel number has been stored. In the operate mode channel numbers are again generated to access the memory locations and logic circuitry determines when the generated channel numbers correspond to preselected (stored) channel numbers to provide tuning thereto.

5 Claims, 4 Drawing Figures

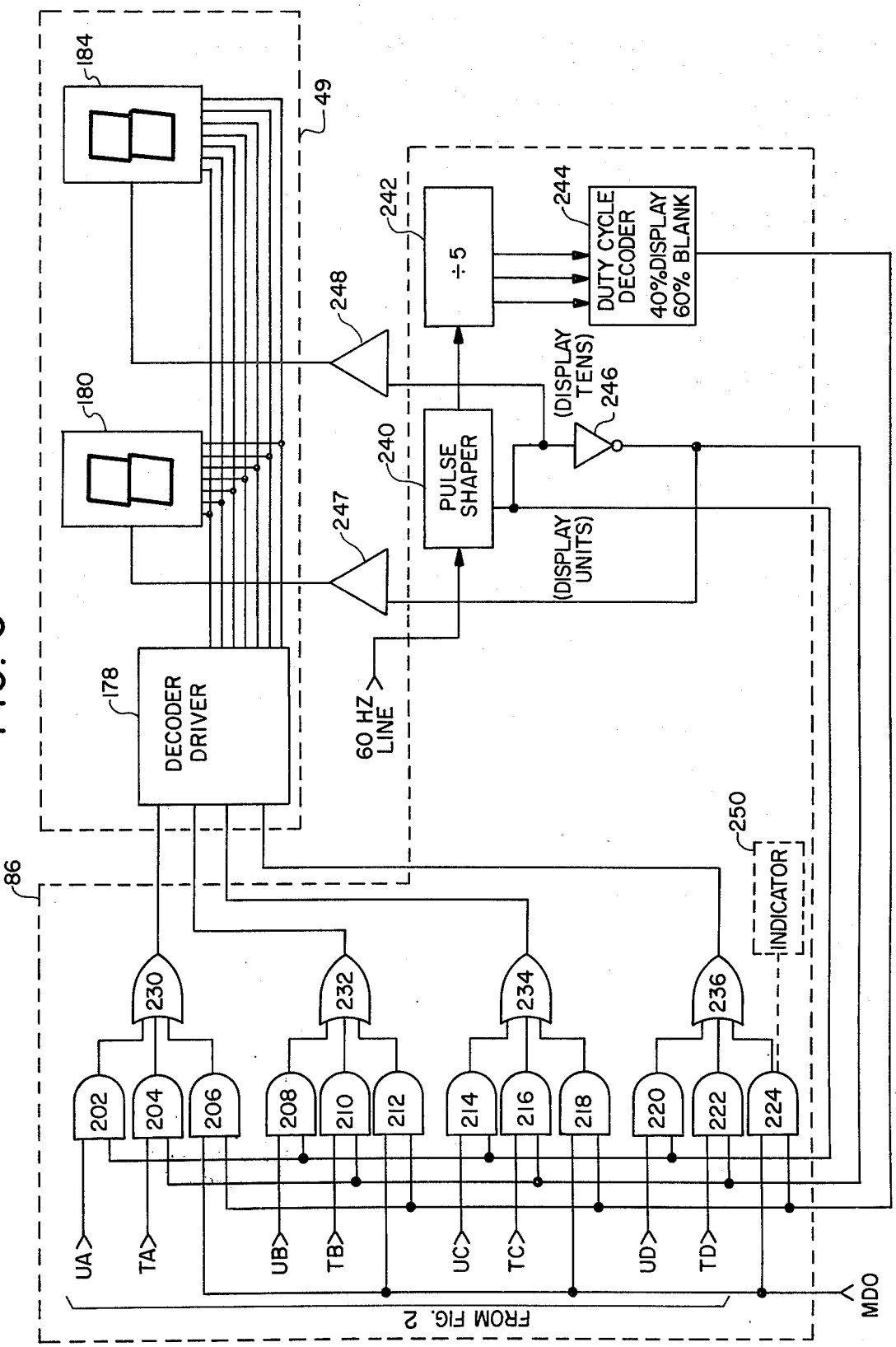

CHANNEL SELECTION INDICATOR FOR MEMORY TUNING SYSTEM

CROSS REFERENCE TO RELATED APPLICATIONS

This application is related to application Ser. No. 621,911, filed Oct. 14, 1975, entitled "Sequential Channel Tuning System with a Memory", Ser. No. 641,782, filed Dec. 18, 1975 entitled "Memory Tuning System with Different Speeds in Program and Operate Modes", Ser. No. 646,116, filed Jan. 2, 1976 entitled "Memory Tuning System with Dual Speed Programming", Ser. No. 646,720, filed Jan. 5, 1976 entitled "Memory Tuning System with Automatic Two Speed Display", all in the name of Akio Tanaka and Ser. No. 601,562, filed Aug. 4, 1975, in the name of Wilbert Parisoe, all assigned to Zenith Radio Corporation.

BACKGROUND OF THE INVENTION

This invention is related to varactor television tuning systems which vary tuning frequency by a change in applied voltage to a varactor diode tuning device. More specifically, it relates to the form of varactor television tuning systems which selectively tune to desired television channels according to a predetermined channel program sequence which has been stored in a memory.

A versatile memory tuning system is completely disclosed and claimed in application Ser. No. 466,579, filed May 3, 1974 in the names of John Ma and Akio Tanaka now U.S. Pat. No. 3,946,319 and entitled "All Electronic Digital Tuner System with Memory" and assigned to the assignee of the present application. The memory may be programmed in any desired sequence to provide sequential tuning among a selected group of channels. The completed channel number on display device serves as an indication that tuning information corresponding to the selected channel number has been stored. Storage locations are accessed at some convenient speed and appropriate tuning information is stored at the individual locations. The advantages of such a tuning system with a memory are readily apparent since the viewer need sequence through only desired channels. The memory has sufficient capacity to hold the digits of the desired channel number, normally in binary encoded decimal form. The speed at which memory locations are accessed and the stored tuning information extracted is so rapid that the change of stored selections appears to be instantaneous.

A characteristic of all memory tuning systems is that they normally have two modes of operation, a program mode in which channel selections are made and an operate mode in which channel selections are recalled. With varactor diode tuners, channel selection involves supplying a proper DC tuning voltage to the tuner. The mechanism for supplying the proper voltages may range from digitally accessed adjustable potentiometers to binary memories for storing channel numbers. In the operate mode the viewer then only sweeps through the limited number of preselected channel numbers for tuning to the desired channel.

Application Ser. No. 457,010, filed April 1, 1974, now U.S. Pat. No. 3,931,579 dated Jan. 6, 1976, in the name of John Ma and Akio Tanaka entitled "Digital Signal Seeking Tuning System" and assigned to Zenith Radio Corporation discloses a television tuning system which includes channel counters operating sequentially to generate desired channel numbers. As each channel number is generated the system responds by tuning to the frequency location corresponding to the channel number. The system also utilizes signal recognition means to determine if a receivable signal is present at that frequency location and stops additional channel number generation until reactivated by the viewer. This use of channel counters to generate channel number information greatly simplifies the tuning system for the viewer, but no provision is made for a memory to store selected information.

A memory of the type which stores selected tuning information could be added to such a channel counter system to provide a convenient method of selecting from all possible channels only those channels which the viewer desires. Such a memory is described in the related application, Ser. No. 621,911 and its preferred embodiment includes an indicator light which is illuminated when a channel has been selected. As with all memory systems, in the program mode the operator selects among all available channels and creates the sequence of desired channels available in his locations for subsequent viewing. In the operate mode the viewer chooses from those selected channels the particular channel he wishes to view.

With this system a single device, the counter, both generates the tuning information and accesses the memory location. A problem arises in the program mode to indicate to the viewer when a channel number has been stored. The completed entry of two digits is not suitable as an indicator since the counter always generates complete channel numbers. In the preferred embodiment of this invention the channel number display devices are used to indicate selection of a channel number. As channel numbers are generated the display is blanked at a low rate so that the viewer observes repetitive flashing of the numbers. When a particular channel number is selected the flashing display for that number ends and the display is continuous.

OBJECTS OF THE INVENTION

An object of this invention is to provide a novel tuning system.

Another object of this invention is to provide an improved memory tuning system with a convenient indicator for the storage of selected channels.

SUMMARY OF THE INVENTION

A television tuning system includes counting means, generating sequential channel numbers for tuning all channels, display means coupled to said counting means displaying the tens and units digits of generated channel numbers, and read/write memory means coupled to the counting means accessed by generated channel numbers and having a plurality of addressable locations for storage and recall of signals related to selected channel numbers. Mode selection means are also included for establishing a program mode for storage of the signals and an operate mode for recall from the memory means of the signals to cause tuning to channels corresponding to the addresses of individual locations of the memory means, clock means generating timing pulses at predetermined rates and indicator means coupled to the memory means indicating storage of said signals. Also blanking encoder means are included coupled between the clock means and the indicator means for causing a distinctive illumination sequence in the indicator means for distinguishing between selected and non-selected channel numbers.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 3 shows the detailed circuitry of blocks 86 and 49; and

DESCRIPTION OF THE PREFERRED EMBODIMENT

The preferred embodiment comprises circuitry for a bimodal television tuning system using channel counters to generate sequential channel numbers with the tuning system responding by tuning to the corresponding television channel. Of particular interest in the preferred embodiment of the invention is the operation of an addressable read/write memory. The generated channel numbers are made to correspond to unique locations or addresses in the memory. In the system program mode, additional circuitry allows the storing of a 1 or 0 logic level at that memory location to indicate respectively preselection or non-preselection of the corresponding channel number. As additional channel numbers are generated additional signals can be stored in the memory at corresponding locations to preselect any number of desired channels.

In the operate mode, the addressable read/write memory is interrogated at each location to determine if the corresponding channel number has been preselected. If the logic level at the corresponding memory location is at 1, the channel number has been preselected and the channel counters sequential generation of channel numbers is interrupted with the system tuning to that preselected channel. If the logic level at a location is 0 or when the viewer reactivates the switch to cause advancement of the channel counters, the counters advance at a high speed until arriving at the next preselected channel.

Practically speaking, the viewer sets the receiver to the program mode and sequences the channel number counters until a desired channel number is generated. Since this will normally be done during times that the broadcast signal is present, the corresponding television channel signal will simultaneously be received. The generated channel number is displayed and continues to flash until selected for storage in the memory. He then sets the memory (by simply pushing a button) and then sequences the counters to the next desired channel number, whereupon he again sets the memory appropriately. All non-selected channel numbers continue to flash when generated while selected ones have a continuous display. The speed at which the counter is sequenced is slow enough to allow the viewer time to recognize the channel number and make his selection. After programming the receiver to receive all desired channels, the receiver is placed in the operate mode. Thereafter in response to an Up or Down command (either by a push button or by remote control) the receiver channel counters operate very rapidly by sequencing through non-selected channel numbers until the next preselected channel number is generated. Thus, only those preselected television channel signals are receivable in the operate mode. The many novel features of the tuning system are described in this application though claimed in the above-mentioned related applications. The present invention is directed to the indicator system for distinguishing selected channel numbers in the program mode.

Figure 1:
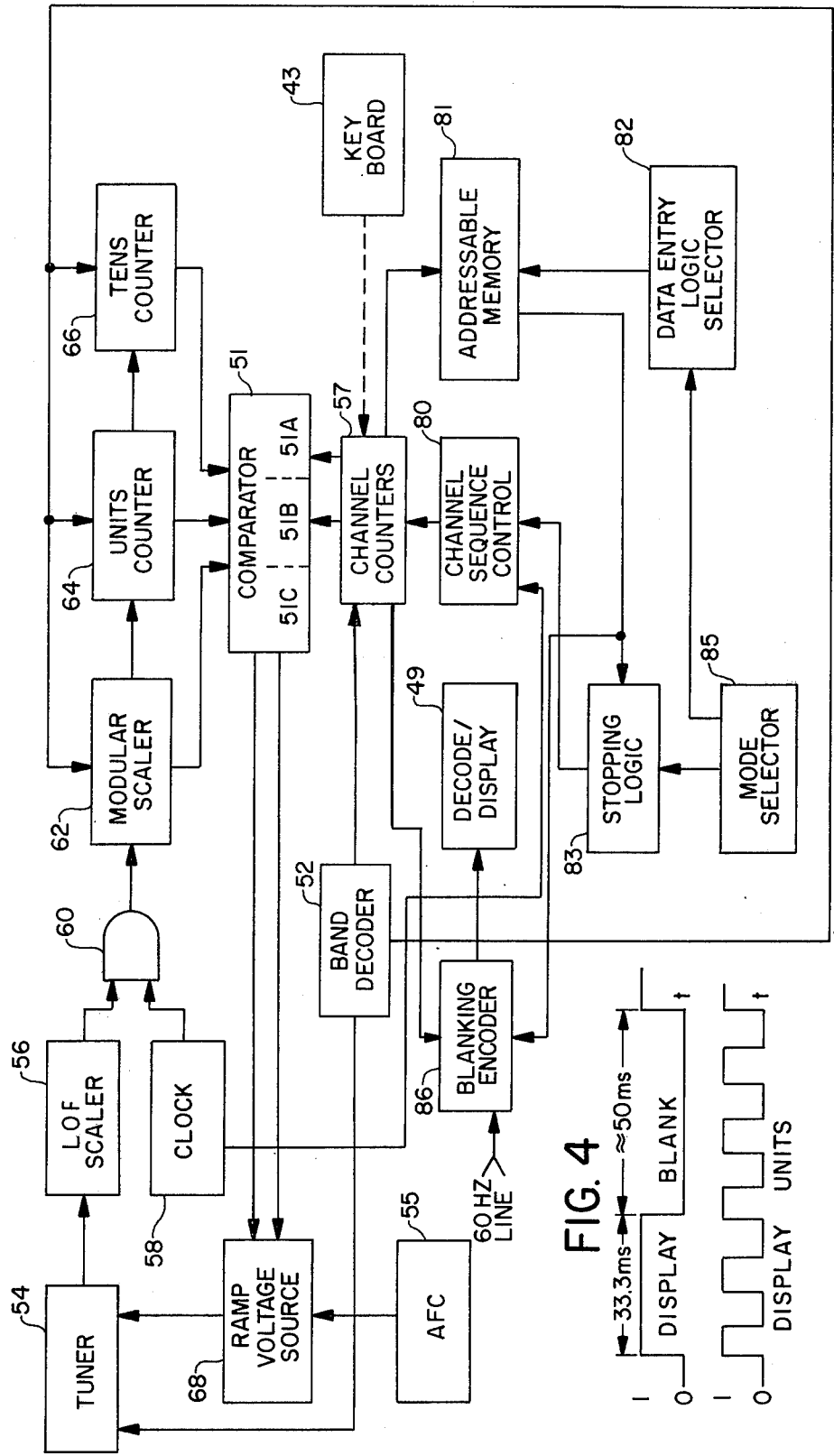
FIG. 1 depicts, in block diagram form, a tuning system employing the invention.

FIG. 1 is a block diagram depicting a tuning system constructed in accordance with the invention. A clock pulse generator 58 supplies a train of regularly spaced pulses to a channel sequence control 80 which divides down the signal to provide various timing pulses and includes the logic gates for applying these timing pulses to channel counters 57. Channel counters 57 generate channel numbers and supply information directly to a comparator 51. A decode display unit 49 provides a visual indication of the generated channel number along with an indication of selected channel numbers and is coupled directly to the output of a blanking encoder 86. An additional output of channel counters 57 is coupled to an addressable memory 81 which contains a plurality of addressable locations and to blanking encoder 86. Blanking encoder 86 receives a 60Hz line input as a timing source for the flashing or blanking rate. The generated channel numbers of channel counters 57 are employed to address the various locations of memory 81. The information stored at each of the addressable locations of memory 81 is determined by data entry logic selector 82. The output of addressable memory 81 is coupled to blanking encoder 86 to provide a distinguishing visual display when the generated channel number corresponds to a selected channel number. Addressable memory 81 is also coupled to stopping logic 83 which is coupled to channel sequence control 80. Channel sequence control 80 advances pulses to channel counters 57 for tuning and displaying the generated channel number and to address unique memory locations in addressable memory 81. A mode selector 85 is coupled to both a stopping logic circuit 83 and to a data entry logic selector 82. The position of mode selector 85 determines the system mode and, during the program mode, stopping logic 83 is disabled and data entry logic selector 82 is enabled to permit entry of data into the memory locations. In the operate mode, data entry logic selector is disabled and stopping logic 83 is enabled to interrupt the advancement of channel counters 57 when the generated channel number corresponds to a preselected number. A keyboard 43 is connected by a broken line as an optional connection to channel counters 57 which would permit tuning to a specific channel by presetting channel counters 57 to the desired channel number.

Another output of channel counters 57 is connected to a band decoder 52 which determines, from the encoded channel information in channel counters 57, 1)in which of the several discontinuous frequency bands the selected channel is; 2)which of UHF or VHF circuitry in the tuner is activated; and 3)the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and units and tens counters which determine the channel number corresponding to the television frequency to which the tuner is tuned. The circuitry from the LOF scaler to the comparator constitutes the channel computing means.

The outputs of modular scaler 62 and counters 64 and 66 are connected to a comparator 51 which has a modular section 51C, a units section 51B and a tens section 51A. Sections 51B and 51A are also supplied the desired or selected channel number from channel counter 57. The derived (computed) channel number is compared with the desired channel number and signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number.

DEFINITIONS

For simplicity, only logic connections are shown in the figures and only voltage sources and grounds necessary to establish the logic control signal levels are shown. Positive logic is used throughout and logic gates are simply referred to by their function names, i.e., AND, NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

The terms "input" and "output" generally indicate the device terminal unless signal is specified. The term "inhibit" indicates the condition in which a gate output is no longer dependent upon signals applied to its remaining inputs. The term "enable" designates the condition in which a gate output is dependent upon the signals applied to the remaining inputs.

The IC implementation for the logic circuit of the preferred embodiment is CMOS which designates complementary symmetry-metal oxide semiconductor. Complementary symmetry is a design arrangement in which N and P channel devices are symmetrically combined so that there is an active pull up and pull down effect on the output signal. MOS describes the form of fabrication of the various layers which constitute the electronic devices.

Figure 2:
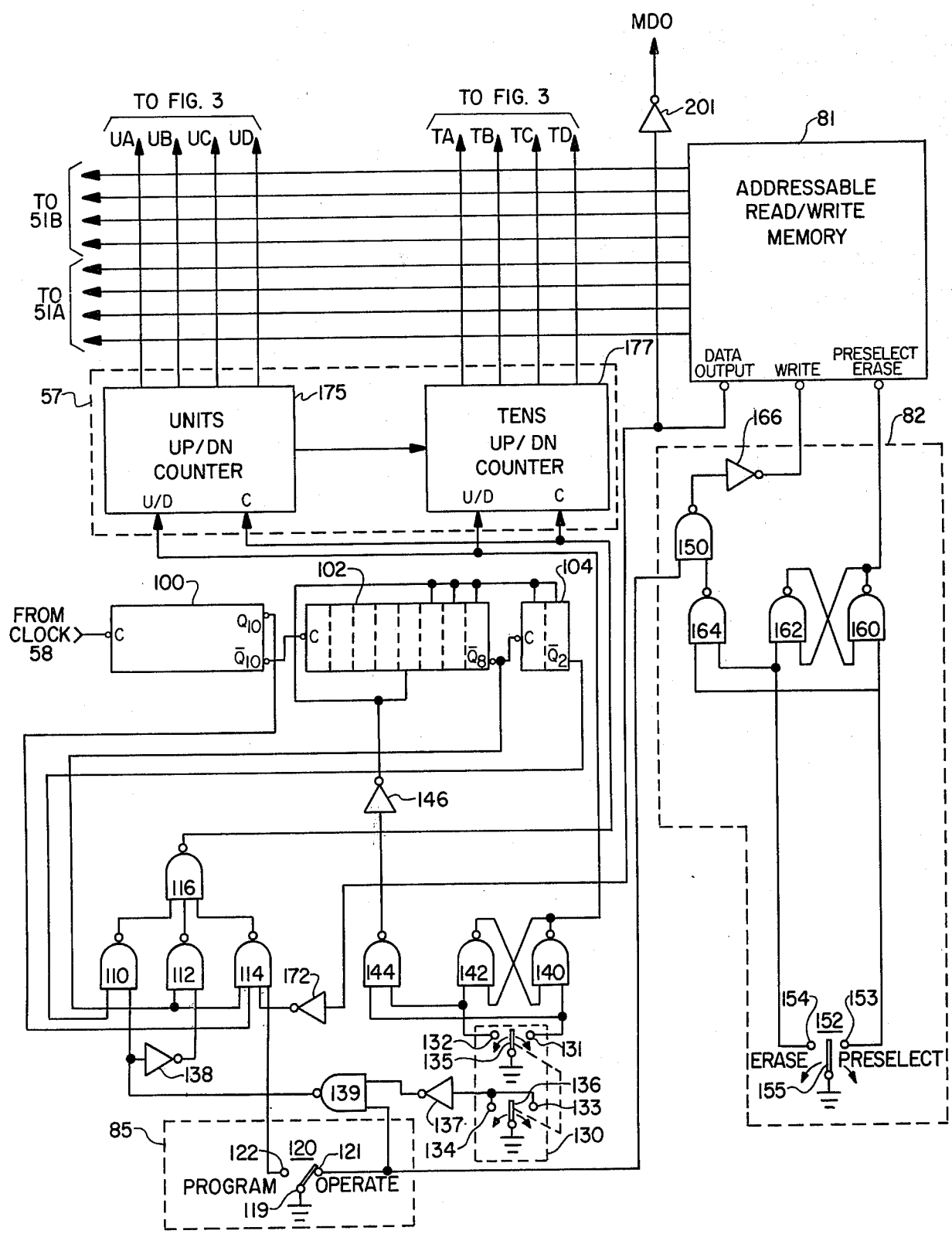
FIG. 2 shows the detailed circuitry of blocks 80, 81, 82, 83, 84 and 85 of FIG. 1.

In FIG. 2 clock 58 is connected to the C terminal of a first flip/flop of a dividing circuit 100 which consists of 10 JK CMOS flip/flops connected in series, with the J and K terminals coupled to a voltage source to establish them at a 1 level. JK flip/flops have two conditioning inputs and one clock input and the response of the device depends upon the states of the conditioning inputs immediately prior to receiving a clock pulse. If both conditioning inputs (J and K) are at 0, the flip/flop will remain in its present state when a clock pulse is received; if the J input is at 1 and the K at 0, the flip/flop will go to the 1 condition; if the J is at 0 and the K at 1, the flip/flop will go to the 0 condition; if both J and K are at 1, the flip/flop will go to the complement or opposite state. The interconnection of flip/flops to provide binary counting is well known in the art and the numerical divisor for this series of flip/flops constituting dividing circuit 100 is 1024. The Q terminal of the 10th flip/flop of dividing circuit 100 is coupled to a first input of a NAND 114 and its $\overline{Q}$ terminal is coupled to the C terminal of a first flip/flop of dividing circuit 102.

Dividing circuit 102 consists of 8 flip/flops arranged for binary counting in the same manner as dividing circuit 100 and has a numerical divisor of 256. The binary counting interconnections for dividing circuit 102 are also well known in the art. The $\overline{Q}$ terminal of the 8th flip/flop of dividing circuit 102 is coupled to a first input of a NAND 112, a second input of a NAND 114 and to the C terminal of the first flip/flop of dividing circuit 104. Dividing circuit 104 consists of 2 JK flip/flops which are interconnected in the same manner as dividing circuits 100 and 102 providing additional binary counting with a numerical divisor of 4. The $\overline{Q}$ terminal of the second flip/flop is coupled to a first input of a NAND 110.

The outputs of NAND's 110, 112 and 114 are coupled to the inputs of a NAND 116. These four NAND's along with inverter 172 comprise the channel skip control means. The output of NAND 116 is coupled to the C terminals of a tens counter 177 and a units counter 175 which are enclosed by a dash line box and designated channel counters 57. A program/operate switch 120 having a grounded contactor 119 is shown positioned for the operate mode. Contactor terminal 121 is coupled to a first input of a NAND 150 and to a first input of a NAND 139 and contactor terminal 122 is coupled to a third input of NAND 114. The preferred embodiment has several speed features but the claims of this application concern a selected channel number indicator.

Momentary switch 130, enclosed by a broken line box, has a terminal 131 coupled to a first input of a NAND 140 and to the first input of a NAND 144. A terminal 132 is coupled to a first input of a NAND 142 and to a second input of NAND 144. Terminals 133 and 134 are connected together and to the input of an inverter 137 whose output is coupled to an input of NAND 139. The output of NAND 139 is coupled to an inverter 138 and to a second input of NAND 110. The output of inverter 138 is coupled to a second input of NAND 112. Although shown as separate switches a broken line couples grounded contactors 135 and 136 to indicate a mechanical connection. When pressure is applied to momentary switch 130, contactor 135 makes a connection with either of terminals 131 or 132. As additional pressure is applied contactor 136 makes a connection with corresponding terminals 133 or 134. This additional pressure on this switch in the preferred embodiment causes selectable faster sequencing of channel counters 57 in the program mode. The preferred embodiment contains additional speed features which are described below.

NAND's 140 and 142 are cross connected to form an RS flip/flop. An RS flip/flop has only set (S) and reset (R) inputs. For the preferred embodiment, a 0 at the S terminal causes the output of the flip/flop to be at 1; a 0 at the R terminal causes the output to be at 0. A 0 at both the R and S results in an indeterminate state which is generally not allowed to occur. The output of NAND 142 is coupled to a second input of NAND 140 and the output of NAND 140 is coupled to a second input of NAND 142. The output of NAND 140 is coupled to the U/D terminals of units counter 175 and tens counter 177. The state of the NAND's 140 and 142 RS flip/flop arrangement establishes the counting direction of the tens and units counters by providing either a 1 or 0 voltage level.

NAND 144 is coupled through an inverter 146 to the fifth, sixth, seventh and eighth flip/flops of dividing circuit 102 and to both flip/flops of dividing circuit 104. The normal 0 signal at the output of NAND 144 is inverted to force a particular preset state into the dividing circuits 102 and 104 to provide a time delay. Forcing a preset effectively disables the counting action of dividing circuits 102 and 104.

To insure the relative logic levels in FIG. 2, switch terminals 121, 122, 131, 132, 133, 134, 153, 154 are coupled through a resistor to a source of voltage to establish them at a 1 level. When in direct contact with ground these terminals will be at a 0 level.

A momentary contact switch 152 has a grounded contactor 155, a preset terminal 153 coupled to a first input of a NAND 160 and to a first input of a NAND 164, and an erase terminal 154 coupled to a first input of a NAND 162 and to a second input of NAND 164. NAND's 160 and 162 are cross connected in the form of an RS flip/flop with the output of NAND 162 coupled to a second input of NAND 160 and the output of NAND 160 coupled to a second input of NAND 162. The output of NAND 160 is also coupled to the preselect/erase terminal of a read/write memory 81 and provides 0 and 1 voltage levels as the information for storage at the addressable locations. The output of NAND 164 is coupled to a second input of NAND 150. The output of NAND 150 is coupled through an inverter 166 the write terminal of read/write memory 81 for enabling the storing information at the various addressable locations.

Channel counters 57 address particular locations in read/write memory 81 but no data may be stored until the write terminal is enabled. Memory 81 has a data output terminal coupled through an inverter 172 to a fourth input of NAND 114 and through an inverter 201 to form a signal labeled MDO.

Units counter 175 is coupled to tens counter 177 to provide proper advancement of the tens counter for the 9-0 transition in the units counter. The units and tens counters each comprise well known binary counters and provide an encoding of the channel number digits. The output terminals of units counter 175 are coupled to the address terminals of read/write memory 81 and to comparator 51B; the output terminals of tens counter 177 are also coupled to the address terminals of read/write memory 81 and to comparator 51A. The four binary outputs of units counter 175 are labeled UA, UB, UC and UD and represent in ascending order the binary representation of a generated units digit. Similarly, the outputs of tens counter 177 are labeled TA, TB, TC and TD and form the binary representation of the generated tens digit. The outputs from the channel counters along with the MDO signal are shown as connecting with FIG. 3.

For FIG. 3 the outputs of units counter 175 and tens counter 177 along with a signal labeled MDO are combined in a series of logic gates which form part of the blanking encoder. The UA, UB, UC and UD terminals of units counter 175 are each coupled respectively to the first input of an AND 202, and AND 208, and AND 214 and an AND 220. The TA, TB, TC and TD outputs of tens counter 177 are each coupled respectively to the first input of an AND 204, an AND 210, an AND 216 and an AND 222. The output of inverter 201 (signal labeled MDO) is coupled to the first input each of an AND 206, an AND 212, AND 218 and AND 224. The AND gates comprise four groups of 3 AND's each. The outputs of AND 202, 204, 206 are each coupled to the inputs of an OR 230; the outputs of AND 208, AND 210 and AND 212 are coupled to the inputs of an OR 232; the outputs of AND 214, AND 216 and AND 218 are coupled to the inputs of OR 234; and the outputs of AND 220, AND 222 and AND 224 are coupled to the inputs of OR 236. The outputs of OR's 230, 232, 234 and 236 are coupled to the inputs of decoder driver 178. Decoder driver 178 converts the binary encoded signals from the OR's into signals for displaying the channel numbers. The outputs of decoder driver 178 are coupled to units display 184 and tens display 180. Decoder driver 178 along with display units 180 and 184 are enclosed in a broken line box and labeled 49 which is the decode/display block of FIG. 1.

Figure 4:
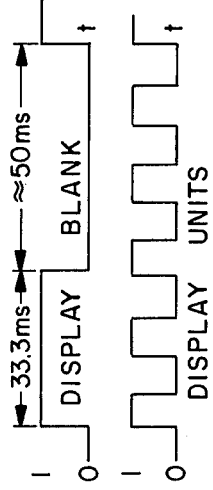
FIG. 4 shows a time diagram of the display and blanking pulses in the program mode.

A 60Hz line source is coupled to pulse shaper 240 which takes the normal sine wave and through a well known electronic process reshapes them into pulses with edges that are well defined and may be used as counting pulses. One output of pulse shaper 240 is labeled display units and is coupled to the second inputs of AND 220, AND 214, AND 208 and AND 202. This same output of pulse shaper 240 is inverted by inverter 246 (labeled display tens) and is coupled to the second inputs of AND 222, AND 216, AND 210 and AND 204. A second input of pulse shaper 240 is coupled directly to divider 242 which provides a divide by five operation. Divider 242 is a well known combination of binary flip/flops which provide an output pulse for every fifth input pulse, thus, achieving a divide by five operation. Three outputs are shown from divider 242 coupled to duty cycle decoder 244 which converts the divided down timing pulses into a pulse signal for display and blanking of the channel number display devices. The output of duty cycle decoder 244 is a signal which corresponds to a 40% display time and a 60% blank time. This is shown in FIG. 4 and will be described more completely later. This output is coupled to the second input of AND 224, AND 218, AND 212 and AND 206. Pulse shaper 240, divider 242, duty cycle decoder 244 and the logic gates are all enclosed by a broken line box and labeled 86 which is the blanking encoder block of FIG. 1.

The output of inverter 246 is coupled to a buffer amplifier 247 having an output coupled to tens display unit 180 for providing the anode voltage and current for appropriately triggering the display of information.

Similarly, the first output of pulse shaper 240 is coupled to an input of buffer amplifier 248 having an output coupled to units display device 184. This also serves to amplify the voltage and current for triggering the anode of the display device in proper sequencing with the information at decoder driver 178.

A dash line output from AND 224 is shown coupled to a broken line box labeled indicator and having reference number 250. This is an alternative way of indicating when a channel number has been selected. In such an alternative system, one could eliminate AND's 206, 212 and 218. Rather than flashing the digits display devices to indicate non-selection, a simple illuminating device could be used to indicate when channel selection had occurred. In this particular variation, the indicator light would flash until a channel number had been selected at which time it would remain constant.

In operation, clock 58 supplies a series of timing pulses at a frequency approximately 2MHz. The numeric divisors for dividing circuits 100, 102 and 104 provide divided down timing pulses at the approximate frequencies of 2KHz, 8Hz and 2Hz respectively. These three frequencies of timing pulses provide three different speeds for the sequencing of channel counters 57. The output of NAND 144 is normally at 0. When momentary contact switch 130 is actuated, either terminal 131 or 132 is grounded causing the output at NAND 144 to be at 1 for as long as the switch is maintained in that position. This 1 level signal is inverted by inverter 146 and releases the last four flip/flops of dividing circuit 102 and both flip/flops of dividing circuit 104 from their normally forced preset condition.

When the switch is released the flip/flops are no longer disabled and initially a particular binary configuration with the states of the first 14 flip/flops being ignored. Clock 58 continues to supply pulses to the dividing circuits and when all of the flip/flops go from the 1 to the 0 state the counting pulse for channel counters 57 is produced. This preset arrangement is arbitrary and provides a time delay before counting the clock signal to produce sequencing of channel counter 57. The length of the time delay is chosen to establish stabilization of all signals to prevent contact bounce.

NAND's 110, 112, 114 and 116 constitute a NAND-NAND cascade arrangement and, at the occurrence of all 1 level signals at the inputs of any of NAND's 110, 112 and 114, the output from NAND 116 will also be at 1. NAND 110 accepts signal from dividing circuit 104 which corresponds to the approximate 2Hz counting frequency. NAND 112 accepts the signal from dividing circuit 102 which corresponds to the approximate 8Hz counting frequency or rate. Both NAND 110 and 112, in the alternative, pass the timing pulses through NAND 116 for advancement of the channel counters.

It should be noted that terminals 133 and 134 of momentary switch 130, which are normally at a 1 level, and are doubly inverted by inverter 137 and NAND 139 enable NAND 110 and through inverter 138 disable NAND 112 in both program and operate modes. Grounded contactor 136 contacting either terminal 133 or 134 results in the disabling of NAND 110 and the enabling of NAND 112 only in the program mode. In the operate mode only the slow 2Hz frequency is allowed to pass through NAND 110 or the very high speed 2KHz through NAND 114 as will be explained later. However, in the program mode either gate 110 or 112 supplies counting pulses through NAND 116 to channel counters 57 and the speed is dependent upon the pressure applied to switch 130. Terminal 121 at a 1 level (program mode) enables NAND 139 to respond to terminals 133 and 134 of switch 130.

Thus, two selectable speeds of counting are provided in the program mode. NAND 114 is also responsive to the signal from the last flip/flop of dividing circuit 102 to insure the proper timing relationship among all of the counting pulses.

With terminal 122 of switch 120 at 1 level (operate mode) NAND 114 is enabled to respond to a 0 level signal at the output of inverter 172 to terminate supplying counting pulses through NAND 116 which, as will be explained later, corresponds to detecting a preselected channel.

Although NAND's 110 and 112 are enabled only in the alternative in the program mode NAND 114 is enabled simultaneously with NAND 110 in the operate mode. In the operate mode, a 1 level at the output of inverter 172 enables NAND 114 to provide a train of counting pulses (during the normal half cycle of the 8Hz pulse counting frequency) which operates as an override to provide very rapid (2KHz) advancement of the channel counters. The approximate 2KHz was chosen to provide counting through all possible channels during the half period of the 8Hz pulse frequency. Thus, if only 1 channel has been preselected then the system will advance through all possible channels and arrive again at the single preselected number. The circuit functions to rapidly skip all non-preselected channel numbers until it reaches another preselected channel number. At this point the system will stop if switch 130 has been released or pause if the switch continues to be actuated.

Units counter 175 and tens counter 177 are well known four stage binary counters interconnected to provide clocking for two digit channel numbers. The output of NAND 116 provides pulses to the counters which advance on each positive going edge. In the actual embodiment of the tuning system incorporating the invention, an up/down decade counter with preset terminals such as MCM 14516 is used. The preset feature of the up/down counter is incorporated to permit the inclusion of an external keyboard as shown by reference number 43 as an option in FIG. 1. The use of such a keyboard could force the establishment of a particular binary state into the counters thus causing tuning to a specific channel rather than automatically generating sequential channel numbers. As stated earlier, NAND 140 and 142 are coupled to form an RS flip/flop with the output of NAND 140 coupled to the U/D terminals of units counter 175 and tens counter 177, with a 1 corresponding to counting up and 0 corresponding to counting down.

At the outputs of channel counters 175 and 177 are standard binary encoded representation of the channel number digits. The binary encoded representation of the channel digits are supplied to blanking encoder 86. Blanking encoder 86 multiplexes the binary encoded signal on a time basis and supplies this information to decoder driver 178. The use of a 60Hz line source for a multiplexing clock is fully described and claimed in the Parisoe application, Ser. No. 601,562. This permits the use of a single decoder driver for the two sets of information comprising the tens and units digits. In addition to multiplexing, blanking encoder 86 employs a clock derived from the line pulse frequency to supply the timing pulses for the multiplexing operation and to add a blanking and display rate for illumination of the display devices. Duty cycle decoder 244 accepts the 12 per second timing pulses from divider 242 and combines two of those periods for a display period and three for a blanking period. For example, if the counting sequence for divider 242 is represented by 0, 1, 2, 3, 4, 0, 1, 2, 3, 4 . . . , then the 0 and 1 states can be described as the display interval. This provides a 40% display time and 60% blank time and is diagrammatically shown in FIG. 4. The display units pulse is a 60Hz square wave and the display tens pulse is merely the inversion of this display unit pulse. Superimposed on the display units and display tens pulse rates which provide the sequenced timing for the multiplexing operation is the display and blanking timing pulse which overrides the multiplexing pulses.

If the display and blanking pulse were not employed, the information from units and tens counters would be multiplexed on a continual basis through decoder driver 178 and displayed in the appropriate display units 180 and 184. However, duty cycle decoder 244 in combination with the data output terminal of memory 81, provide timing pulses which can be used to flash an indicator whenever channel numbers have been selected. An alternative form of the preferred embodiment is shown in a broken line box labeled indicator with the reference number 250. As stated earlier in the specification, the use of this device would allow a simplification in that AND's 206, 212 and 218 could be eliminated. However, the preferred embodiment employs the blanking signal to cause a flashing of the units and tens display devices.

It should be understood that the multiplexing occurs at such a rate that it is not perceptible by a viewer. However, the blanking is completely perceptible and has been designed so that the viewers attention will be drawn to it. In actual operation, decoder driver 178 may comprise a BCD to 7 segment device converter such as a MC7447 by Motorola, and the corresponding display devices can be 7 segment displays such as HP 7651 (LED) having common anodes. When the described devices are suitably connected the generated channel numbers can be visually displayed by the described multiplex operation.

Each input of decoder driver 178 is derived from an OR gate with inputs which are coupled to the outputs of the three AND gates of one group. In all there are 12 AND gates comprising 4 groups of three AND's each. The first AND in each group has an input coupled to a binary output terminal from units counter 175. The second AND has a binary output terminal from tens counter 177 and the third AND has an input coupled to the data output terminal of memory 81. The first AND in each group is alternately enabled and inhibited by the display units pulse from pulse shaper 240. Thus, at appropriate times determined by the 60Hz clock, pulse shaper 240 enables the first AND of each group to pass through the OR gates the binary information corresponding to the units digit. Similarly, the inverted pulse train from pulse shaper 240 is coupled to the second AND in each group and alternately enables those gates to pass the corresponding binary information generated by tens counter 177. Thus, it may be seen that the first two gates in each of group of three are alternately enabled and disabled to allow units and tens information to be multiplexed on a time basis through the corresponding OR gates.

In addition to this operation, the logic state of the addressed storage location in memory 81 controls the application of the blanking operation. A 1 level at a storage position indicative of a selected channel number is inverted by inverter 201 to inhibit the third AND gate in each of the four groups. Thus, the output of the duty cycle decoder 244 becomes ineffective whenever the generated channel number has been selected and stored in memory 81. However, should the storage location contain a 0 logic level corresponding to a non-selected channel, this signal level is inverted by inverter 201 and the third AND gate in each group is enabled to allow the timing pulse from duty cycle decoder 244 to superimpose a signal to decoder driver 178. As described earlier, this timing relationship is shown in FIG. 4. However, because of the individual devices chosen for the preferred embodiment, duty cycle decoder 244 must have a 1 level pulse corresponding to blanking and a 0 level pulse corresponding to display. This permits the outputs of all four OR gates to be at 1 for blanking since an MC 7447 decoder driver will recognize all 1 levels at its inputs as a blanking code.

In the preferred embodiment the actual pulse shaper from duty cycle decoder 244 is the inverse of the first diagram in FIG. 4. As long as the MDO signal level remains at 1 which corresponds to non-selected channels, the third gate in each group will be enabled causing the 1 level blanking pulse to repetitively superimpose its signal and cause a blanking at the output of decoder driver 178 and subsequent blanking of both display units. It may be observed that in the operate mode no flashing will occur since only selected channel numbers will be displayed. The binary encoded outputs of channel counters 175 and 177 are also supplied to comparator 51B and 51A respectively. This portion of the comparator compares the derived channel number with the now generated channel number to control system tuning.

The binary encoded outputs of channel counters 175 and 177 are additionally supplied to read/write memory 81. In the preferred embodiment this memory is a 256 × 1 RAM (random access memory) of which 82 addressable locations are utilized. Such memories include decoding circuitry to convert binary encoded inputs to access unique locations. In the preferred embodiment a memory such as a CD 4061 is used.

When switch 120 is in the program mode, momentary contact switch 152 permits a viewer to preselect a given channel. The terminals of switch 152 are labeled preselect and erase. The erase terminal 154 is employed to remove a previously placed preselect signal at a location. Grounded contactor 155 contacting terminal 153 corresponds to preselecting a channel number corresponding to a unique address memory in 200. A 1 level signal is stored at that corresponding location. Similarly, grounded contactor 155 contacting terminal 154 places a 0 at the corresponding location. Data entry logic selector circuit 82 is the source for the signals to be placed in read/write memory 81. NAND's 160 and 162 are coupled as an RS flip/flop and a 0 level at terminal 153 causes the output of NAND 160 to be at 1 which corresponds to preselecting a given channel number. Similarly, a 0 level signal at terminal 154 causes the output of NAND 160 to be at 0 (erase).

Both inputs of NAND 164 are normally at 1 thus insuring that normally its output is at 0. With switch 120 in program mode the first input of NAND 150 is at 1 and when grounded contactor 155 contacts within terminal 153 or 154, the normally 0 output at NAND 164 becomes 1 for as long as contact is maintained. Since both inputs of NAND 150 are at 1 its output is 0 while the output of inverter 166 goes to 1. It is this positive going edge (from 0 to 1), resulting from activation of momentary switch 152, which causes storage of a signal corresponding to the logic state represented by the output of NAND 160 into the unique location which has been addressed by units and tens channel counters 175 and 177. In the operate mode the effect of momentary switch 152 is disabled since NAND 150 is inhibited to prevent any writing into memory. Thus, nothing can be changed in the memory wherein the system is in the operate mode.

In response to interrogation, a data output terminal of memory 81 supplies logic levels of the memory at the addressed location. As stated earlier, a 1 level corresponds to having preselected a corresponding channel number while a 0 indicates no preselection. This data output terminal is coupled to a display means which may comprise of a non-inverting buffer amplifier coupled to an ordinary LED which is connected through a resistor to ground. It will be appreciated that many forms of display units may be used which respond to a 1 level corresponding to a preselected channel by giving some type of visual indication.

The data output terminal of read/write memory 200 is also coupled through inverter 172 to an input of NAND 114. A 1 level at an addressable location produces a 0 level at the output of NAND 172 thus interrupting the very fast (approximate 2KHz) channel counting by channel counters 175 and 177. A 0 level at an addressable location produces a 1 level at the output of inverter 172 which enables NAND 114 to provide the 2KHz counting rate for rapid channel advancement. It should again be appreciated that NAND 114 is only enabled in the operate mode and, therefore, can not provide the rapid channel advancement when preselecting channel numbers in the program mode.

Activation of momentary switch 130 establishes counting at 2 or 8Hz rates in the program mode and once established it continues until the switch is released, thereby, forcing presets into dividing circuits 102 and 104 to disable their operation. In the operate mode if the switch is maintained in contact, the channel counters are not stopped but rather are advanced at 2Hz so that the viewer may observe the generated channel numbers and react. Now the very rapid channel number advancement provided through enabling NAND 114 in the operate mode allows rapid skipping through non-preselected channels while selected channels can be displayed for some convenient period. Although display devices 180 and 184 operate constantly there is no perceptible display during the rapid advancement. Continued activation of momentary switch 130 will cause continued advancement to the next preselected channel which will be displayed for a period of time and again the system will very rapidly advance to the next preselected channel.

What has been shown is an all channel television tuning system which sequentially generates channel numbers to provide tuning to corresponding channels which have been previously selected and stored in a memory. In the program mode the units and tens digits displays are forced to flash for all generated channel numbers and this flashing ceases only when a number has been stored. This provides a tuning system which is easily programmable with a distinctive indicator system to distinguish selected channels.

While there have been described particular embodiments of the present invention, it is apparent that changes and modifications may be made therein without departing from the invention in the broader aspects. The aim of the appended claims, therefore, is to cover all such changes and modifications as fall within the true spirit and scope of the invention.

What is claimed is:

1. A television tuning system including:
   counting means, generating sequential channel numbers for tuning all channels;
   display means coupled to said counting means displaying the tens and units digits of generated channel numbers;
   read/write memory means coupled to said counting means accessed by said generated channel numbers and having a plurality of addressable locations for storage and recall of signals related to selected channel numbers;
   mode selection means coupled to said counting means and said memory means for establishing a program mode for storage of said signals and an operate mode for recall from said memory means of said signals to cause tuning to channels corresponding to the addresses of individual locations of said memory means;
   a clock means generating timing pulses at predetermined rates;
   indicator means coupled to said memory means indicating storage of said signals; and
   blanking encoder means coupled between said clock means and said indicator means for causing a distinctive illumination sequence in said indicator means for distinguishing between selected and non-selected channel numbers.

2. The television tuning system of claim 1 wherein said display means includes said indicator means and said blanking encoder means includes logic means for repetitively flashing the display of said tens and units digits at a visually perceptible rate to designate non-selected channel numbers.

3. The television tuning system of claim 2 wherein said clock means includes means for deriving timing pulses from a source of 60Hz power.

4. The television tuning system of claim 3 wherein the ratio of display time to the blanking time of said visually perceptible flashing rate is 2 to 3.

5. The television tuning system of claim 4 wherein said logic means comprises at least one AND gate having inputs coupled to said memory means and said clock means.

* * * * *